United States Patent [19]

Merrem et al.

[11] Patent Number: 4,842,901
[45] Date of Patent: Jun. 27, 1989

[54] COATING SOLUTION AND PROCESS FOR PRODUCING GLASSY LAYERS

[75] Inventors: Hans-Joachim Merrem, Seeheim-Jugenheim; Werner Graf, Burghausen, both of Fed. Rep. of Germany

[73] Assignee: Hoechst Aktiengesellschaft, Frankfurt, Fed. Rep. of Germany

[21] Appl. No.: 151,547

[22] Filed: Feb. 2, 1988

[30] Foreign Application Priority Data

Feb. 13, 1987 [DE] Fed. Rep. of Germany ....... 3704518

[51] Int. Cl.$^4$ .............................................. B05D 3/02
[52] U.S. Cl. .................................. 427/387; 427/388.1; 427/397.7; 427/409; 106/287.1
[58] Field of Search .................. 427/387, 388.1, 397.7, 427/409; 106/287.1

[56] References Cited

U.S. PATENT DOCUMENTS

| 2,917,467 | 12/1959 | Olson et al. | |
| 3,615,943 | 10/1971 | Genser | 148/188 |
| 3,789,023 | 1/1974 | Ritchie | 252/518 |
| 3,832,202 | 8/1974 | Ritchie | 106/287 SE |
| 3,837,873 | 9/1974 | Pollack et al. | 106/287 SE |
| 3,915,766 | 10/1975 | Pollack et al. | 148/188 |
| 3,928,225 | 12/1975 | Schäfer | 252/182 |
| 4,152,286 | 5/1979 | Crosson et al. | 252/182 |
| 4,190,699 | 2/1980 | Kanazawa | 427/387 |
| 4,243,427 | 1/1981 | DiBugnara | 106/287.16 |
| 4,269,757 | 5/1981 | Mine | 427/388.1 |
| 4,305,979 | 12/1981 | Isarai | 427/388.1 |
| 4,410,570 | 10/1983 | Krenzer | 427/387 |
| 4,510,283 | 4/1985 | Takeda et al. | 524/356 |
| 4,615,782 | 10/1986 | Namatsu et al. | 204/192.36 |
| 4,619,719 | 10/1986 | Thomas et al. | 148/188 |
| 4,731,294 | 3/1988 | Pouchol | 427/388.1 |

FOREIGN PATENT DOCUMENTS

| 2447204 | 4/1976 | Fed. Rep. of Germany . |
| 2530574 | 1/1977 | Fed. Rep. of Germany . |
| 2920673 | 11/1980 | Fed. Rep. of Germany . |
| 2922900 | 12/1980 | Fed. Rep. of Germany . |
| 2952116A1 | 7/1981 | Fed. Rep. of Germany . |
| 3030298A1 | 3/1982 | Fed. Rep. of Germany . |
| 3537626A1 | 4/1986 | Fed. Rep. of Germany . |

OTHER PUBLICATIONS

H. Binder, et al., "The Influence of Striations in AZ 1350 H Photoresist Films on the Generation of Small Geometries," *Colloque International sur la Microlithographie,* Paris 21st–24th Jun., 1977 (Imprimerie E.M.F. 887-85-83) pp. 248–253.
English translation of WPI Abstract of German Offenlegungschrift No. 3,537,626.

*Primary Examiner*—Shrive Beck
*Assistant Examiner*—Vi Duong Dang
*Attorney, Agent, or Firm*—Foley & Lardner, Schwartz, Jeffery, Schwaab, Mack, Blumenthal & Evans

[57] ABSTRACT

A coating solution for producing glassy layers on a substrate comprises a silicic acid ester, an aliphatic alcohol as a solvent, an acid in a catalytically active quantity, and water. The alcohol contains at least 4 carbon atoms and the acid has a $pK_a$ of less than +3. The viscosity of the coating solution is table even at elevated temperatures and the amount of water added is increased. The glassy layers produced from the coating solution exhibit no striations.

18 Claims, No Drawings

COATING SOLUTION AND PROCESS FOR PRODUCING GLASSY LAYERS

BACKGROUND OF THE INVENTION

The present invention describes a coating solution for producing glassy layers on a substrate, and also a process for producing such coatings.

Processes for producing glassy layers from solutions of polyorganosiloxanes have been known for a long time. If a solution of this sort contains one or more dopants, for example, elements belonging to Group III and Group V of the periodic system, which are normally used as free acids, as oxide hydrates, as alkoxides or as oxides, the glassy layers produced from the solution can be used for doping semiconductor substrates.

But glassy layers without dopants are used as gettering layers for removing undesirable impurities from semiconductor substrates. They are also used as insulating layers, for example, in semiconductor technology or in the production of liquid crystal displays. In addition, it is known that glassy layers without dopants can be used as planarization layers in the production of semiconductor components, and as plasma-etch-resistant intermediate layers in multilayer systems for producing highly resolved patterns.

In all these applications, a uniform layer thickness has to be ensured, since a nonuniform layer thickness can considerably impair the insulating and masking functions of the layer. If a nonuniform layer is etched, for example, undesirable variations may occur in the dimensional fidelity of the pattern transfer. In the case of plasma etching processes, the intensity of the attack on the substrate situated beneath the layer is variable, so that variations in layer thickness may be transferred to the substrate.

If a glassy layer produced with a conventional coating solution is coated with a photoresist layer, a nonuniformity in the glassy layer (spin-on glass layer) may result in variations in exposure when the resist layer is exposed to monochromatic light via a projection process. Consequently, exposure errors in the resist can arise because the interferences produced in the thin glassy layer result, due to the varying thickness of the layer, in reflection differences.

If a spun-on glassy layer is used as a diffusion source for dopant material, variations may arise in the doping of a semiconductor material by virtue of nonuniformity in the thickness of the layer.

The polyorganosiloxanes contained in glassy layers may be produced in a number of ways, in accordance with the varying nature of the coating solution. For example, U.S. Pat. No. 3,615,943 describes coating solutions that contain reaction products of silicon tetrachloride and acetic anhydride. The disadvantage of these products is, on the one hand, the expensive production associated with the starting materials mentioned and, on the other hand, the high temperature (at least 225° C.) necessary to produce a glassy layer. No statements are made in the aforementioned patent on the stability of the coating solution, or on the uniformity of the surface of the resulting layer. The layer optionally may contain dopant material comprising the elements B, P, As, Sb, Cd, In, Ga and Al.

Reaction products that are produced in ethanol from tetraethyl orthosilicate, with the use of acetic anhydride and a dopant material comprising the elements B, P, As, Au and Zn as glass-forming components, are described in U.S. Pat. Nos. 3,837,873 and 3,915,766. Nothing is said in either patent as to the coating uniformity.

U.S. Pat. No. 4,152,286 also describes a coating solution in which tetraethyl orthosilicate reacts with acetic anhydride, but in a solvent mixture comprising ethoxyethanol and diethyl phthalate. It is argued that, in contrast to the solutions disclosed in U.S. Pat. Nos. 3,837,873 and 3,915,766, respectively, formation of a precipitate (crystallization of $B_2O_3$ dopant, shortly after the "spin-on" step can be avoided by the use of this solvent mixture. No statement is made on storage stability or layer quality.

Since the content of high-boiling acetic anhydride is very high in the solutions disclosed in all the documents hitherto discussed, baking out at high temperatures is unavoidable.

Particularly uniform layers on semiconductor substrates are said to be obtained according to German Offenlegungsschrift No. 2,340,111 (corresponding to U.S. Pat. No. 3,789,023). Approximately 3% of glycerol is added to adjust the viscosity of dopant-containing solutions containing tetraethyl orthosilicate in ethanol and ethyl acetate. Alcohols higher than ethanol are not mentioned as solvents. No statement on the storage stability of the coating solution is included.

According to German Offenlegungsschrift No. 2,338,079 (corresponding to U.S. Pat. No. 3,832,202), a further improvement in the surface uniformity is obtained with mixtures comprising vinyltrichlorosilane reacted with ethanol and tetraethyl orthosilicate dissolved in aqueous ethanol to which glycerine has been added. But this approach is described as entailing a two-component system only, i.e., the mixture of the various components is indicated not to be storage stable.

Coating solutions for doping semiconductor substrates are described in German Offenlegungschriften No. 2,447,204; No. 2,530,574; No. 2,920,673; No. 2,952,116 and No. 3,030,298. These solutions contain tetralkyl orthosilicate, preferably tetraethyl orthosilicate, and an aqueous solution of a dopant in an alcohol, preferably methanol or 2-propanol. Furthermore, higher boiling components like polypropylene glycol may be added, as described in German Offenlegungsschrift No. 2,920,673. None of the cited patent documents refers to the shelf life of the solutions; nor is any mention made of higher alcohols as solvents.

U.S. Pat. No. 3,928,225 describes a boron-containing doping solution containing a tetraethyl orthosilicate, a metal salt (Ni, Pb, Ca, Sn), an organic acid in ethanol and ethylene glycol monomethyl ether or ethylene glycol, in which the polymerization temperature of the silicic acid ester can be reduced by adding lactic acid. No statements are made in relation to shelf life or layer quality.

U.S. Pat. No. 4,243,427 mentions a solution that is highly doped with phosphorus. This solution is described, however, as a two-component system consisting of a solution of tetraethyl orthosilicate in methanol and aqueous/methanolic phosphoric acid (as $Al(H_2PO_4)_3$), it being necessary to mix the two components for forming a coating and to process them immediately, due to their instability.

From German Offenlegungsschrift No. 2,922,900, it is known that coatings available hitherto may exhibit layer-thickness differences (so-called "striations"). The tetraethyl orthosilicate solution in acetone described in the cited patent document is polymerized by adding nitric acid. Addition of silicone oil is said to eliminate the "striations." The coating solution is described as a two-component system, with the implication of a short shelf life for the ready-to-use solution.

A coating solution which contains a prepolymer, poly(silsesquioxane), in addition to poly(ethoxysiloxane) or poly(methoxysiloxane) is described in European patent application No. 0 112 168. In this case, the uniformity of the coating is claimed to be achieved by the combination of the two polymers, while the use of poly(ethoxysiloxane) alone results in "striations." The solution described is subjected to a vacuum treatment to remove residues of acid, especially of hydrochloric acid, which is used as catalyst for the hydrolysis. In order to keep evaporation loss low, solvents with a boiling point higher than 110° (1 bar) are disclosed. If the acid is not removed by vacuum treatment, the solutions gel within 30 days.

A coating solution based on poly(organosiloxane) is described in European patent application No. 167 854. Since the poly(organosiloxane) layer cannot be adequately cross-linked, it remains soluble in organic solvents and, as a rule, has to be converted superficially to $SiO_2$ in an oxygen plasma in order to achieve the necessary solvent resistance. Otherwise there is the risk of the formation of undefined mixed layers if photoresists are spun onto the uncured layer.

German Offenlegungsschrift No. 3,247,173 describes a stable doping solution in which the glass-forming component is produced by reaction of tetraethyl orthosilicate with an acidic dopant in the presence of a catalytically active quantity of a strong mineral acid or a Lewis acid in an anhydrous solvent, preferably anhydrous ethanol or propanol. The water necessary for the hydrolysis of the tetraethyl orthosilicate has to be added in a quantity which is less than the stoichiometric quantity, since otherwise the material gels and, in addition, a precipitate is formed. The access of additional atmospheric water therefore has to be prevented in an expensive manner. No examples of dopant-free coating solutions are mentioned.

A coating solution which does not contain dopants is described in German Offenlegungsschrift No. 3,537,626. It is comprised of a mixture of a tetraalkyl orthosilicate, a vinyltrialkoxysilane or vinyltriacyloxysilane and/or a γ-glycidoxypropyltrialkoxysilane in a solvent containing a low aliphatic alcohol and water, to which a catalytic quantity of a mineral acid is optionally added. The layers produced from this solution contain nonhydrolyzable organic residues and, as a consequence, are dissolved by organic solvents if the drying temperature is too low. If such a layer is part of a multilayer system, an oxygen-containing plasma has to be used for plasma-etching the layer in order to remove the organic residues. The photoresist layers situated on top are also attacked at the same time, so that dimensional fidelity of the pattern transfers is not possible. No statements are made in the cited patent document concerning the storage stability of the coating solution and/or the uniformity of the spun-on layer.

SUMMARY OF THE INVENTION

It is therefore an object of the present invention to provide a coating solution, useful in producing supported glassy layers, that can be made simply and inexpensively, which solution exhibits enhanced storage stability and yields, when spun onto a substrate and dried, a layer of substantially uniform flatness, i.e., a layer without striations.

It is also an object of the present invention to provide a process for coating substrates, particularly semiconductor substrates and liquid-crystal displays, in a manner ensuring that the resulting glassy layer has a uniform thickness and composition, all without the need for post-layering treatment to remove residues.

In accomplishing the foregoing objects, there has been provided, in accordance with one aspect of the present invention, a coating solution for producing glassy layers on a substrate, containing a silicic acid ester, a solvent comprised on an aliphatic alcohol, a catalytically active quantity of acid, and water, wherein the alcohol has at least 4 carbon atoms and the acid has a $pK_a$ of less than $+3$. In preferred embodiments, the alcohol can be monohydric or polyhydric, particularly dihydric, a bimeric or trimeric alcohol, and partially or oligomerically etherified. The acid should have a $pK_a$ value in the range between about $+2$ to $-6$.

In accordance with another aspect of the present invention, a process has also been provided for producing, with the above-described coating solution, a striation-free glassy layer on a substrate. The process comprises the steps of producing a homogeneous mixture comprised of the silicic acid ester, the solvent, the acid and water; polycondensing the silicic acid ester at a temperature ranging between about 0° and 120° C.; thereafter depositing the coating solution on a substrate; and then heat-treating the substrate such that a glassy layer is produced thereon.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The disadvantages described above for known coating solutions are avoided in the coating solutions of the present invention. At the same time, the latter solutions have the following additional advantages:

(1) The solutions are storage-stable over a prolonged period even at elevated temperatures, i.e., a maximum increase in the viscosity of the solution of only 7%, preferably not more than 3%, is measured over a storage time of 25 days at +50° C., without detectable gelation or formation of a precipitate.

(2) The stability of the viscosity is maintained even if water is added in excess to the stoichiometric requirement for hydrolysis; access of atmospheric moisture consequently impairs storage stability only to a negligibly small extent.

(3) The solutions of the present invention can be produced in a simple manner by mixing the individual components; a special purification of the solution, for example, to remove undesirable acid residues via vacuum treatment, is not necessary.

(4) After curing, as a rule by heating to 150° to 200° C. for to 5 minutes on a hotplate, the glassy layers resulting from the spinning-on of the coating solution are resistant to organic solvents, in particular to photoresist solvents like ethylene glycol methyl ether acetate and propylene glycol methyl ether acetate.

(5) The cured glassy layers exhibit a high uniformity, so that no "striations" are detectable when the layers are exposed to monochromatic light.

As previously indicated, the term "striations" refers to irregularities in the surface of layers that are spin-coated onto suitable substrates. Striations can be detected in some cases with the naked eye; with mechanical layer-thickness measuring instruments, as surface roughness (layer-thickness difference between layer-thickness maxima and minima of about 5 to 200 nm); and also with a microscope equipped with an interference filter (nonuniform intensity distribution of the reflected incident light). In the latter context, layers that exhibit a homogeneous appearance in incident light are described as free of striations, i.e., as having a layer-thickness difference of less than 5 nm.

The phenomenon of striation formation is discussed, for example, in "The Influence of Striations in AZ 1350 H Photoresist Films on the Generation of Small Geometries," *Colloque International sur la Microlithographie,* Paris 21st 24th June 77 (Imprimerie E.M.F. 887-85-83), by H. Binder, R. Sigusch and D. Widmann. According to this disclosure, striations may be produced by thickness differences in the layer or by optical-density differences resulting from the nonhomogeneous composition of the layer. Such thickness differences in turn may be produced by evaporation of readily volatile solvent during the time the solution is being spun onto the substrate, and by the resulting, very rapid hardening of the layer surface, while the low-volatility components are at the same time driven outwardly by centrifugal force. Nonuniformities in the layer thickness are the direct consequence.

The following are illustrative of suitable hydrolyzable silicic acid esters in coating solutions of the present invention:
single tetraalkoxysilanes,
such as
   tetramethoxysilane,
   tetraethoxysilane,
   tetrapropoxysilane,
   tetrabutoxysilane and also higher and mixed representatives;
single tetra(alkoxyalkoxy)silanes,
such as
   tetra(methoxyethoxy)silane,
   tetra(ethoxyethoxy)silane,
   tetra(methoxypropoxy)silane, etc., and also higher and mixed compounds.

Mixtures within one group of substances, or even of substances belonging to several groups, are also suitable.

It is preferable that single and/or mixed tetralkoxysilanes or tetra(alkoxyalkoxy)silanes are used that comprise alkoxy groups with 1 to 5 carbon atoms, respectively. Particularly preferred are prehydrolyzed, single and mixed tetralkoxysilanes in which some of the alkoxy groups or alkoxyalkoxy groups are replaced by the formation of siloxane groups and by hydroxyl groups. The prehydrolysis of the polyalkoxysiloxanes or poly(alkoxyalkoxy)siloxanes can proceed to such an extent that the mean molecular weight of a monomeric unit of the polysiloxane chain may decrease to the value of 120 g/mol.

As a function of the desired viscosity of the coating solution, the content of the silicic acid ester in the layer may be between about 2% to 50% by weight, preferably 5% to 25% by weight, based on the total weight of the coating solution.

Aliphatic alcohols containing at least 4 carbon atoms are suitable as solvents in the present invention. In addition to monohydric, nonetherified alcohols, these include polyhydric alcohols, particularly dihydric alcohols which are partially etherified with monohydric alcohols and contain at least one unetherified hydroxyl group. Also included are oligomerically etherified alcohols, in particular dimers and trimers of dihydric alcohols which are also partially etherified by monohydric alcohols at the end of the chain, a terminal hydroxyl group preferably remaining unetherified.

Particularly preferred are the dihydric alcohols etherified to oligomers by alcohols having the same number of carbon atoms. The monohydric alcohols which are employed to etherify the terminal hydroxyl groups of polyhydric alcohols and oligomeric alcohols preferably contain 1 or 2 carbon atoms.

The number of carbon atoms in the alcohol is determined, in the case of the oligomeric alcohols, by summing the carbon atoms of the polyhydric alcohols in the chain that is linked by oxygen atoms.

The following are mentioned as examples of suitable monohydric alcohols: 1-butanol, 2-butanol, 2-methyl-1-propanol, 2-methyl-2-propanol and 1-pentanol. Illustrative of suitable polyhydric and oligomeric alcohols are: ethylene glycol monoethyl ether, diethylene glycol monoethyl ether, triethylene glycol monoethyl ether, propylene glycol monomethyl ether, dipropylene glycol monomethyl ether and dipropylene glycol monoethyl ether. Equally suitable are mixtures of these alcohols with each other or with other solvents which dissolve in the alcohol or alcohol mixture and which yield a coating solution that provides striations-free glassy layer. The proportion of the alcohol or alcohol mixture is at least 50% by weight, based on the total weight of the solvent.

Particularly preferred are solvent mixtures that contain 1-butanol, 2-methyl-1-propanol or 1-pentanol as the alcohol component. In addition to the silicic acid ester and the solvent or solvent mixture, a coating solution within the present invention contains water in a quantity corresponding to between about 90% and 200% by weight, preferably 100% to 150% by weight, of that quantity of water necessary for the complete hydrolysis of the silicic acid ester.

The acid necessary for the hydrolysis of the silicic acid ester is used in a catalytic quantity of between about 0.01% and 5% by weight, preferably 0.05% to 1% by weight, based on the coating solution. Acids are suitable that have a $pK_a$ value less than $+3$, with values in the range from $+2$ to $-6$ being preferred.

Of these, perchloric acid, hydrochloric acid, sulfuric acid, nitric acid, trifluoroacetic acid, oxalic acid and malonic acid, and polymeric acids such as polystyrenesulfonic acid and the like, are particularly suitable. Particularly preferred are organic acids.

In addition, the coating solutions of the present invention can also contain auxiliary substances, for example, adhesion promoters, surface active substances and dyestuffs in usual quantities.

According to the present invention, the process for producing a striation-free glassy coating on a substrate comprises producing a homogeneous mixture of silicic acid ester, solvent, water and catalytically-active acid; polycondensing the mixture at temperatures between about 0° to 120° C., preferably from 20° to 80° C., and subsequently depositing and drying the coating solution on a substrate. After a heat-treatment of the resulting glassy layer at 150° to 200° C., the layer still contains only negligibly small quantities of organic substances and by-products. The layers can therefore be removed in a precise and complete manner, with etching gases containing fluorine, via a plasma etching process.

The glassy layers produced in this fashion have a layer thickness in the range from 20 nm to 5 μm, preferably from 50 nm to 2 μm.

Photoresist layers can be deposited on the glassy layers by usual methods, the glassy layer being resistant to the solvents contained in the photoresist after it has been cured.

All manner of metal, metal oxide and polymer layers can be used as substrates for coating with the coating solution according to the present invention. Mention is made, in particular, of semiconductor substrates and liquid crystal displays.

The coating solutions produced in the following, nonlimiting examples were stable even after a storage time of 25 days at 50° C. The spun-on layers exhibited no striations.

EXAMPLES 1 to 9

8.0 g of poly(ethoxysiloxane), wherein the monomer units had a molecular weight of $M=120.1$ g/mol on average, were added to 42.0 g of dried and distilled n-butanol, and a homogeneous mixture was prepared. Subsequently, 1.16 g of water and a catalytically-active quantity of acid (about $1.2 \times 10^{-3}$ mol) were added. The reaction time was 72 hours at 50° C.

The solutions were stored at +50° C. for 25 days and the increase in viscosity during this time was measured. The results are reproduced in Table 1.

TABLE 1

| Example No. | Acid | pK$_a$ | Increase in viscosity (%) |
|---|---|---|---|
| 1 | Perchloric acid | −10 | +7.3 |
| 2 | Hydrochloric acid | −6 | +3.8 |
| 3 | Sulfuric acid | −3 | +5.7 |
| 4 | Nitric acid | −1.32 | +2.6 |
| 5 | Trifluoracetic acid | +0.23 | +0.2 |
| 6 | Oxalic acid | +1.24 | +6.5 |
| 7 | Malonic acid | +2.79 | +5.5 |
| 8 | Tartaric acid | +3.01 | gelled |
| 9 | Acetic acid | +4.75 | gelled |

The results show that the pK$_a$ of the acids used have a marked influence on the stability of the poly(ethoxysiloxane) solutions. Weak acids having a pK$_a$>3.0 are associated with an undesirable gelling, while acids with a pK$_a$<3.0 result in stable solutions.

EXAMPLES 10 to 17

8.0 g of the poly(ethoxysiloxane) used in Examples 1–9 were added to 42.0 g of the solvent listed in Table 2, and a homogeneous mixture was prepared. 1.16 g of water and a catalytically active quantity of acid (about $1.2 \times 10^{-3}$ mol) were added and reacted for 72 hours at 50° C.

The increase in viscosity over a period of 25 days at +50° C. is shown in Table 2, as a function of the solvent.

TABLE 2

| Example No. | Solvent | Increase in viscosity (%) |
|---|---|---|
| 10 | Methanol | 14.5 |
| 11 | Ethanol | 1.0 |
| 12 | Ethanol (66 p.b.w.) ethyl acetate (34 p.b.w.) | 4.5 |
| 13 | 2-Propanol | 0.3 |
| 14 | 1-Butanol | 0.2 |
| 15 | 2-Methyl-1-propanol | 0.4 |
| 16 | 1-Pentanol | 2.2 |

EXAMPLES 17 to 23

Each of the solutions mentioned in Examples 10 to 16 was spun onto silicon wafers at 3,000 revolutions per minute and dried at 200° C. for 30 minutes, and the surface quality of the resulting glassy layers as assessed. The layers were tested for striations and for faults. In order to prevent faults due to dust particles, the solutions were subjected to superfine filtering through a filter with a pore diameter of about 0.2 μm. The results are summarized in Table 3.

TABLE 3

| Example No. | Solvent | Layer quality |
|---|---|---|
| 17 | Methanol | pronounced striations |
| 18 | Ethanol | striations |
| 19 | Ethanol (66 p.b.w.) ethyl acetate (34 p.b.w.) | striations |
| 20 | 2-Propanol | striations |
| 21 | 1-Butanol | no striations, no defects |
| 22 | 2-Methyl-1-propanol | no striations, no defects |
| 23 | 1-Pentanol | no striations, no defects |

EXAMPLES 24 to 28

16.0 g of the poly(ethoxysiloxane) used in the foregoing examples were added to 84.0 g of dried and distilled n-butanol, and a homogeneous mixture was prepared. Subsequently, the quantities of water specified in Table 4 were added, along with a catalytically-active quantity of acid (about $1.2 \times 10^{-3}$ mol). The reation time was 72 hours at 50° C. The percentages specified in brackets in Table 4 refer to the necessary quantity of water (100 %=complete hydrolysis).

The solutions were stored at +50° C. for 25 days, and the change in viscosity during this time was measured. The results are shown in Table 4.

TABLE 4

| Example No. | Amount of water added | Change in viscosity (%) |
|---|---|---|
| 24 | 2.07 g (107%) | 5.9 |
| 25 | 2.30 g (118%) | 0.2 |
| 26 | 2.53 g (130%) | 1.7 |
| 27 | 2.76 g (142%) | 1.7 |
| 28 | 3.45 g (178%) | 2.6 |

It is evident that the viscosity of the solution depends to a negligibly small extent on the amount of water added.

EXAMPLES 29 to 32

8.0 g of poly(ethoxysiloxane) as above were added to 42.0 g of dried and distilled 1-pentanol, and a homogeneous mixture was prepared. The amounts of trifluoroacetic acid specified in Table 5, along with a super-stoichiometric quantity (118%) of water, were added, respectively. The solutions were stored at +50° C. for 25 days and the change in viscosity during this time was measured. The results are shown in Table 5.

TABLE 5

| Example No. | Amount of trifluoroacetic acid added | Change in viscosity (%) |
|---|---|---|
| 29 | $6.6 \times 10^{-3}$ g | +11.7 |
| 30 | $26.7 \times 10^{-3}$ g | +5.3 |
| 31 | 0.66 g | +3.3 |
| 32 | 2.67 g | +12.0 |

What is claimed is:

1. A coating solution for producing glassy layers on a substrate, consisting essentially of a silicic acid ester, a solvent comprised of an aliphatic alcohol, a catalytically active quantity of acid, and water, wherein the alcohol has at least 4 carbon atoms and the acid has a $pK_a$ of less than +3.

2. A coating solution as claimed in claim 1, wherein the silicic acid ester is at least one selected from the group consisting of a tetraalkoxysilane, a tetra(alkoxyalkoxy)silane, and a poly(alkoxysiloxane).

3. A coating solution as claimed in claim 2, wherein the silicic acid ester comprises a poly(alkoxysiloxane) that is prehydrolyzed.

4. A coating solution as claimed in claim 1, wherein the silicic acid ester is present in the coating solution in an amount between about 2% to 50% by weight, based on the coating solution.

5. A coating solution as claimed in claim 4, wherein the amount of silicic acid ester is between about 5% and 25% by weight, based on the coating solution.

6. A coating solution as claimed in claim 1, wherein the solvent is a mixture which contains at least 50% by weight of the alcohol.

7. A coating solution as claimed in claim 1, wherein the alcohol is a monohydric or a polyhydric alcohol.

8. A coating solution as claimed in claim 7, wherein the alcohol is dihydric.

9. A coating solution as claimed in claim 7, wherein the alcohol is dimeric or trimeric.

10. A coating solution as claimed in claim 7, wherein the alcohol is partially etherified or is an oligomerically etherified alcohol.

11. A coating solution as claimed in claim 1, wherein the $pK_a$ of the acid is in the range from +2 to −6.

12. A coating solution as claimed in claim 1, wherein the acid is an organic acid.

13. A coating solution as claimed in claim 1, wherein water is present in a quantity of between about 90% and 200%, based on the quantity of water necessary for complete hydrolysis of the silicic acid ester.

14. A process for producing a striation-free glassy layer on a substrate with a coating solution as claimed in claim 1, comprising the steps of producing a homogeneous mixture consisting essentially of the silicic acid ester, the solvent, the acid and water; polycondensing the silicic acid ester at a temperature between about 0° and 120° C.; thereafter depositing and drying the coating solution on a substate, such that a glassy layer is produced thereon; and then heat-treating the glassy layer.

15. A process claimed in claim 14, further comprising the step of depositing a photoresist layer on the glassy layer.

16. A process as claimed in claim 14, wherein the substrate is a metal, a metal oxide or a polymer layer.

17. A process as claimed in claim 16, wherein the substrate is a semiconductor substrate or a liquid crystal display.

18. A process as claimed in claim 14, wherein the glassy layer has a thickness of between about 20 nm and 5.0 μm, after heat-treatment.

* * * * *